(12) United States Patent
Urashima

(10) Patent No.: US 7,803,648 B2
(45) Date of Patent: Sep. 28, 2010

(54) NITRIDE SEMICONDUCTOR LIGHT-EMITTING DEVICE AND METHOD FOR FABRICATION THEREOF

(75) Inventor: Yasuhito Urashima, Ichihara (JP)

(73) Assignee: Showa Denko K.K., Tokyo (JP)

( * ) Notice: Subject to any disclaimer, the term of this patent is extended or adjusted under 35 U.S.C. 154(b) by 462 days.

(21) Appl. No.: 11/885,974

(22) PCT Filed: Feb. 15, 2006

(86) PCT No.: PCT/JP2006/303088

§ 371 (c)(1),
(2), (4) Date: Nov. 16, 2007

(87) PCT Pub. No.: WO2006/095566

PCT Pub. Date: Sep. 14, 2006

(65) Prior Publication Data

US 2008/0191226 A1    Aug. 14, 2008

Related U.S. Application Data

(60) Provisional application No. 60/662,369, filed on Mar. 17, 2005.

(30) Foreign Application Priority Data

Mar. 9, 2005    (JP) .............................. 2005-065074

(51) Int. Cl.
*H01L 21/00* (2006.01)
*H01L 21/36* (2006.01)
*H01L 21/20* (2006.01)

(52) U.S. Cl. .............................. 438/48; 438/22; 438/27; 438/29; 438/31; 438/33; 257/E21.09; 257/E21.104

(58) Field of Classification Search ............ 257/E21.09, 257/E21.104
See application file for complete search history.

(56) References Cited

U.S. PATENT DOCUMENTS 5,309,001 A    5/1994    Watanabe et al.

(Continued)

FOREIGN PATENT DOCUMENTS

JP    61-222285    10/1986

(Continued)

*Primary Examiner*—Charles D Garber
*Assistant Examiner*—Mohsen Ahmadi
(74) *Attorney, Agent, or Firm*—Sughrue Mion. PLLC

(57) ABSTRACT

A nitride semiconductor light-emitting device includes a substrate, a nitride semiconductor layer incorporating therein a first electroconductive semiconductor layer, a light-emitting layer and a second electroconductive semiconductor layer, a transparent electrode contiguous to at least part of a first surface of the second electroconductive semiconductor layer, and a second electrode contiguous to the first electroconductive semiconductor layer; wherein the substrate has a first surface thereof provided with a first region exposed by removal of a first part of the nitride semiconductor layer in a peripheral part of the device and a second region exposed by removal of at least a second part of the nitride semiconductor layer contiguous to the transparent electrode except the peripheral part of the device till the substrate. A method for the production of the device includes removing a first part of the nitride semiconductor layer in a peripheral part of the device till the substrate is exposed to form a first exposed region thereof and removing at least a second part of the nitride semiconductor layer contiguous to the transparent electrode except the peripheral part of the device till the substrate is reached to form a second exposed region thereof, wherein the steps are taken by combining the removal with a laser and the removal by wet etching.

5 Claims, 6 Drawing Sheets

U.S. PATENT DOCUMENTS

| | | |
|---|---|---|
| 6,121,636 A | 9/2000 | Morita et al. |
| 6,433,367 B1 | 8/2002 | Tohyama et al. |
| 2002/0096994 A1* | 7/2002 | Iwafuchi et al. ............. 313/495 |
| 2002/0123164 A1* | 9/2002 | Slater et al. .................. 438/39 |
| 2003/0062529 A1 | 4/2003 | Kato et al. |
| 2004/0004226 A1 | 1/2004 | Eisert et al. |
| 2004/0026700 A1 | 2/2004 | Akaike et al. |
| 2005/0227453 A1 | 10/2005 | Miki et al. |

FOREIGN PATENT DOCUMENTS

| | | |
|---|---|---|
| JP | 6-5912 A | 1/1994 |
| JP | 2784537 | 5/1998 |
| JP | 2836687 | 10/1998 |
| JP | 10-308532 A | 11/1998 |
| JP | 2001-24222 A | 1/2001 |
| JP | 2002-164574 | 6/2002 |
| JP | 2002-270970 A | 9/2002 |
| JP | 2003-86839 A | 3/2003 |
| JP | 2003-110136 A | 4/2003 |
| JP | 2003-243302 A | 8/2003 |
| JP | 2004-503114 A | 1/2004 |
| JP | 2004-87930 A | 3/2004 |
| JP | 2005-39284 A | 2/2005 |

* cited by examiner

F I G. 7
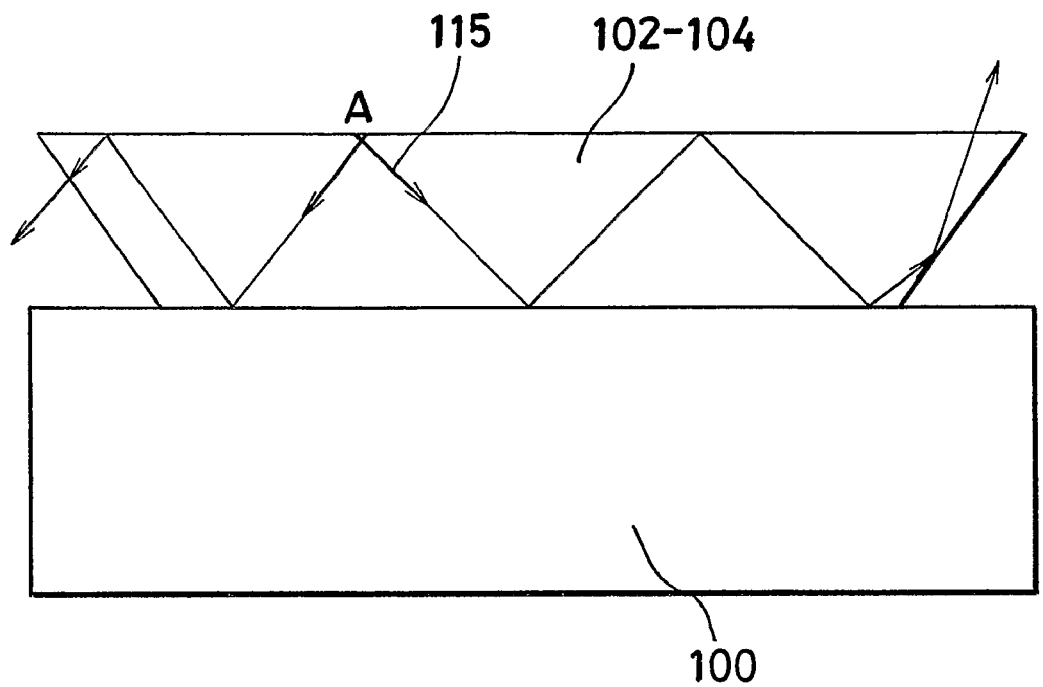
F I G. 8
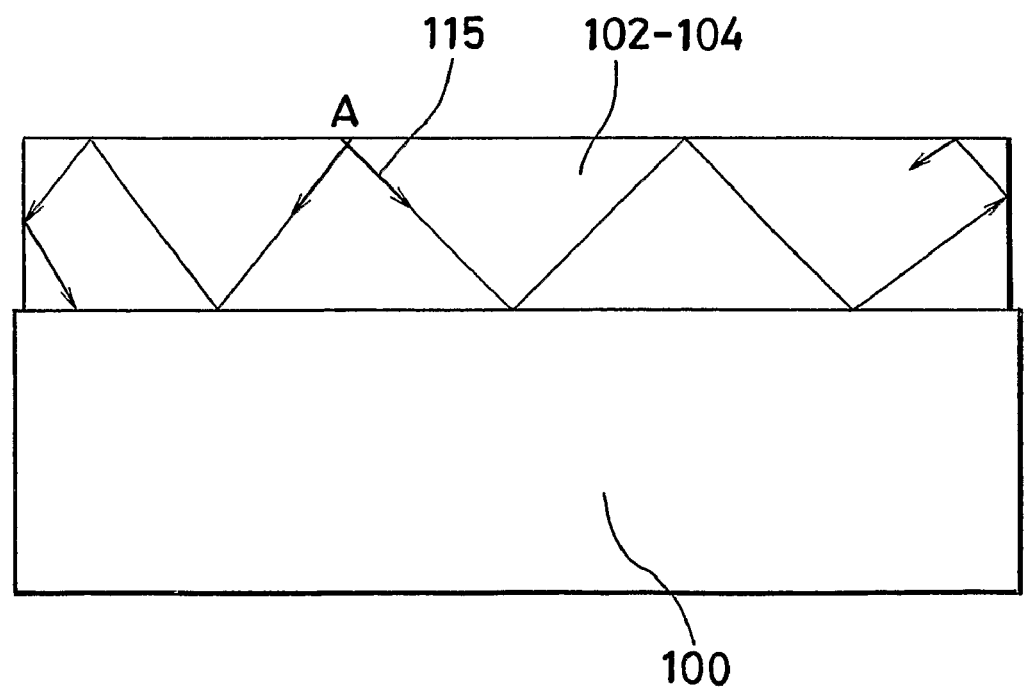

LASER PROCESSING

PROCESSED MARK

AFTER PROCESSING

PROCESSED MARK

AFTER WET ETCHING

NITRIDE SEMICONDUCTOR LIGHT-EMITTING DEVICE AND METHOD FOR FABRICATION THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/662,369 filed Mar. 17, 2005 and Japanese Patent Application No. 2005-065074 filed Mar. 9, 2005 pursuant to 35 U.S.C. §111 (b).

TECHNICAL FIELD

This invention relates to a nitride semiconductor light-emitting device and particularly to a nitride semiconductor light-emitting diode which has enhanced the light-extraction efficiency thereof and a method for the fabrication thereof.

BACKGROUND ART

The Group III nitride semiconductors (abbreviated in this invention as "nitride semiconductors") possess a band gap of a direct transition type of energy corresponding to the visible light through the ultraviolet light range and permit highly efficient light emission and have been consequently reduced to commercial products, such as light-emitting diodes (LEDs) and laser diodes (LDs). Particularly the realization of white light-emitting diodes due to their combination with fluorescent materials has been expected as a new field for the application of light-emitting diodes.

The output of a light-emitting diode is greatly affected by the efficiency of light extraction from a relevant device to the exterior. On this efficiency of light extraction, the total reflection on the surface of the device functions as a factor for imparting a great effect. It is known very well that when a light advances from a semiconductor layer having a large refractive index toward the exterior having a small refractive index, the part of the light exceeding the critical angle (θc) undergoes total reflection on the phase boundary of the device and the light is not extracted to the exterior of the small refractive index.

As a means to avoid the restraint imposed on the light extraction by the total reflection on the phase boundary, a method for coarsening the phase boundary (refer, for example, to Japanese Patent No. 2836687) and a method for forming the shape of the device to utilize the Escape Cone of another surface (refer, for example, to Japanese Patent No. 2784537) have been known.

Ordinary light-emitting diodes are mostly shaped in the form of a rectangular hexahedron on account of the ease of manufacture of device. In this case, the number of phase boundaries that allow formation of Escape Cone is limited to six.

The magnitudes of the particular solid angles of Escape Cones are decided in conformity with the characteristics of the individual boundary phases. As a matter of course, the total of the magnitudes of the individual solid angles increases proportionately to the number of the phase boundaries.

The output of the light-emitting diode device, therefore, is increased by so shaping the light-emitting diode device as to increase the number of planes from the ordinary rectangular hexahedron. The ultimate in the exaltation of the output by the increase of the number of planes resides in the method for forming the device in the shape of a hemispherical dome. Numerous pieces of prior art have been already introduced to this ultimate method (refer, for example, JP-A SHO 61-222285).

The method which resorts to the increase in the number of planes of the device, however, allows no easy formation of the device and consequently entails the problem of seriously degrading the yield of product. Thus, a method which comprises imparting fine grooves to the surface of the device by an etching operation, thereby making substantial addition to the number of planes has been proposed (refer, for example, to JP-A 2002-164574 and JP-A 2004-87930). JP-A 2004-87930 discloses the role of current-preventing grooves which are so formed as to prevent the electric current from being concentrated directly under an electrode.

When the number of planes is substantially increased for the purpose of enhancing the light-extraction efficiency, increasing the surface areas of the consequently added planes increases the effect monotonously. When the surface of the device is subjected to groove formation, the deeper the formed grooves, the higher the light-extraction effect is.

The nitride semiconductor, however, is deficient in reactivity and is not easy to process. Generally, it is processed predominantly by the dry etching which uses a chlorine type gas and performs the etching with a reaction species resulting from exciting the etching gas with plasma. Despite the adoption of the dry etching, the processing speed is prominently low and barely reaches several μm/h.

Further, since the process resorts to the plasma of high energy, it is known to entail electrical breakdown by charged particles and deterioration by ultraviolet radiation. When this etching is continued for a long time with a view to enlarging the amount of processing, it brings no negligible influence and poses the problem of preventing the light-emitting diode from acquiring any enhanced characteristic properties.

This invention is aimed at enhancing the light-extraction efficiency of a nitride semiconductor light-emitting device. It is, therefore, aimed at facilitating the process of shaping the device and enhancing the yield thereof.

This invention has been perfected for the purpose of accomplishing the objects mentioned above and embraces the following aspects of invention.

DISCLOSURE OF THE INVENTION

The present invention provides as the first aspect thereof a nitride semiconductor light-emitting device comprising a substrate, a nitride semiconductor layer incorporating therein a first electroconductive semiconductor layer, a light-emitting layer and a second electroconductive semiconductor layer, a transparent electrode contiguous to at least part of a first surface of the second electroconductive semiconductor layer, and a second electrode contiguous to the first electroconductive semiconductor layer, wherein the substrate has a first surface thereof provided with a first region exposed by removal of a first part of the nitride semiconductor layer in a peripheral part of the device and a second region exposed by removal of at least a second part of the nitride semiconductor layer contiguous to the transparent electrode except the peripheral part of the device till the substrate.

In the second aspect of the invention that includes the first aspect, the first part of the nitride semiconductor layer removed in the peripheral part of the device is increased in a direction of the substrate and at least part of the nitride semiconductor layer contiguous to the substrate subsequent to the removal is consequently enabled to form a lateral face tilted toward the substrate.

In the third aspect of the invention that includes the first or second aspect, the second region of the substrate has part disposed directly below the electrodes.

In the fourth aspect of the invention that includes the second or third aspect, a normal line relative to one of lateral faces of the nitride semiconductor layer defining the second region of the substrate and a normal line relative to the first surface of the substrate form an angle $\theta_1$ larger than 90 degrees and smaller than 180 degrees.

In the fifth aspect of the invention that includes any one of the second to fourth aspects, a normal line relative to one of lateral faces of the nitride semiconductor layer defining the second region of the substrate and a normal line relative to the first surface of the substrate form an angle $\theta_1$ which is 95 degrees or more and 170 degrees or less.

In the sixth aspect of the invention that includes any one of the second to fifth aspects, a normal line relative to one of lateral faces of the nitride semiconductor layer defining the second region of the substrate and a normal line relative to the first surface of the substrate form an angle $\theta_1$ which is 100 degrees or more and 160 degrees or less.

In the seventh aspect of the invention that includes any one of the first to sixth aspects, the second part of the nitride semiconductor layer has a circumference having a length in a range of 1 to 1000% of a length of a circumference of the first part of the nitride semiconductor layer.

In the eighth aspect of the invention that includes any one of the first to seventh aspects, the second part of the nitride semiconductor layer has a circumference having a length in a range of 5 to 500% of a length of a circumference of the first part of the nitride semiconductor layer.

In the ninth aspect of the invention that includes any one of the first to eighth aspects, the second part of the nitride semiconductor layer has a circumference having a length in a range of 10 to 200% of a length of a circumference of the first part of the nitride semiconductor layer.

In the tenth aspect of the invention that includes any one of the first to ninth aspects, the second part of the nitride semiconductor layer is an opening assuming a substantially circular shape.

In the eleventh aspect of the invention that includes any one of the first to tenth aspects, the second part of the nitride semiconductor layer assumes a shape enclosed with substantially straight lines.

In the twelfth aspect of the invention that includes any one of the first to eleventh aspects, the second part of the nitride semiconductor layer is formed at least singly in the nitride semiconductor layer contiguous to the transparent electrode.

In the thirteenth aspect of the invention that includes any one of the first to twelfth aspects, the second region of the substrate has formed therein a processed mark in a shape substantially conforming to the second part of the nitride semiconductor layer.

In the fourteenth aspect of the invention that includes any one of the first to thirteenth aspects, a normal line relative to one of tilted lateral faces of the nitride semiconductor layer defining the first part thereof and a normal line relative to the first surface of the substrate form an angle $\theta_2$ which is larger than 90 degrees and smaller than 180 degrees.

In the fifteenth aspect of the invention that includes any one of the first to fourteenth aspects, a normal line relative to one of tilted lateral faces of the nitride semiconductor layer defining the first part thereof and a normal line relative to the first surface of the substrate form an angle $\theta_2$ which is 95 degrees or more and 170 degrees or less.

In the sixteenth aspect of the invention that includes any one of the first to fifteenth aspects, a normal line relative to one of tilted lateral faces of the nitride semiconductor layer defining the first part thereof and a normal line relative to the first surface of the substrate form an angle $\theta_2$ which is 100 degrees or more and 160 degrees or less.

In the seventeenth aspect of the invention that includes any one of the first to sixteenth aspects, each of the first and second regions of the substrate and lateral faces of the nitride semiconductor layer is provided with a reflecting film.

In the eighteenth aspect of the invention that includes any one of the first to seventeenth aspects, the substrate is formed of sapphire.

The present invention further provides as a nineteenth aspect thereof a method for the production of a nitride semiconductor light-emitting device comprising a substrate, a nitride semiconductor layer incorporating therein a first electroconductive semiconductor layer, a light-emitting layer and a second electroconductive semiconductor layer, a transparent electrode contiguous to at least part of a first surface of the second electroconductive semiconductor layer, and a second electrode contiguous to the first electroconductive semiconductor layer, comprising the steps of removing a first part of the nitride semiconductor layer in a peripheral part of the device till the substrate is exposed to form a first exposed region thereof and removing at least a second part of the nitride semiconductor layer contiguous to the transparent electrode except the peripheral part of the device till the substrate is reached to form a second exposed region thereof, wherein the steps are taken by combining the removal with a laser and the removal by wet etching.

In a twentieth aspect of the invention that includes the nineteenth aspect, the removal of at least the second part of the nitride semiconductor layer is increased in a direction of the substrate by controlling conditions of the wet etching so as to provide the semiconductor layer remaining after the removal with a lateral face tilted toward the substrate.

In a twenty-first aspect of the invention that includes the nineteenth or twentieth aspect, the removal of at least the second part of the nitride semiconductor layer is enabled by controlling conditions of the wet etching to have part of the second exposed region of the substrate fall directly below the electrodes.

In a twenty-second aspect of the invention that includes any one of the nineteenth to twenty-first aspects, the second exposed region of the substrate is provided at a substantially central part thereof with a processed mark in a shape substantially conforming to a shape of the second part of the nitride semiconductor layer by a process using a laser.

In a twenty-third aspect of the invention that includes any one of the nineteenth to twenty-second aspects, the nitride semiconductor layer having the first part removed has a lateral face tilted outwardly by controlling conditions of the wet etching during the removal of the first part of the nitride semiconductor layer.

The present invention further provides as a twenty-fourth aspect thereof a light source combining the nitride semiconductor light-emitting device of any one of the first to eighteenth aspects with a fluorescent material.

The present invention further provides as a twenty-fifth aspect thereof a lighting fixture provided with the light source of the twenty-fourth aspect.

According to this invention, it is made possible to enhance the light-extraction efficiency and as well attain the shaping process of a relevant device by a process inducing no heavy damage and promoting the enhancement of the yield. This invention further has an effect of preventing the electric current from being concentrated directly under the electrode and enabling the light to be emitted in a wide range within the nitride semiconductor layer.

The above and other objects, characteristic features and advantages of the present invention will become apparent to those skilled in the art from the description made herein below with reference to the accompanying drawings.

BRIEF DESCRIPTION OF THE DRAWINGS

FIG. 7 is an explanatory diagram illustrating the advance of light in the light-emitting device of this invention.

FIG. 8 is an explanatory diagram illustrating the advance of light in a conventional light-emitting device.

BEST MODE FOR CARRYING OUT THE INVENTION

The nitride semiconductor light-emitting device of this invention, as described in the first aspect thereof has the first surface of the substrate provided in the peripheral part of the device with a first region exposed by the removal of a first part of the nitride semiconductor layer and has at least a second part of the nitride semiconductor layer contiguous to the transparent electrode except the peripheral part of the device (the first surface of the semiconductor layer) removed till the substrate is reached and consequently provided with a second part exposing a second region of the first surface of the substrate. The invention set forth in the second aspect thereof increases the removal of the nitride semiconductor layer toward the substrate and consequently enables at least the part of the lateral face of the nitride semiconductor layer remaining after the removal which is contiguous to the substrate to be tilted toward the substrate. This tilt may be formed in one or both of the interior and the exterior of the peripheral part of the device, preferably in both of them.

Now, this invention will be explained in detail below with reference to the accompanying diagrams.

Figure 1:
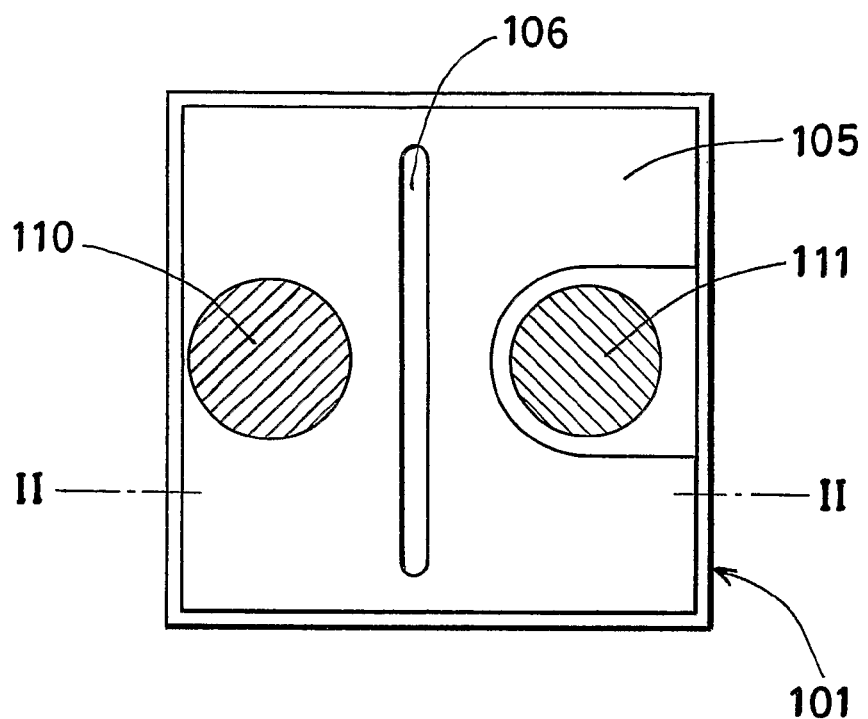
FIG. 1 is a plan view of a nitride semiconductor light-emitting diode produced in Example 1.
Figure 2:
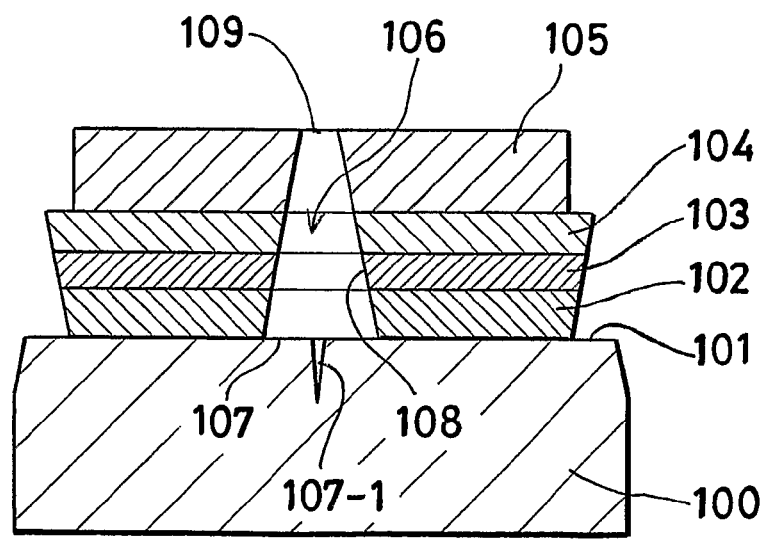
FIG. 2 is a cross-sectional view taken through FIG. 1 along line II-II.

FIG. 1 is a plan view illustrating one example of the nitride semiconductor light-emitting device contemplated by this invention and FIG. 2 is a cross-sectional view taken through FIG. 1 along line II-II. In the diagrams, reference numeral 100 denotes a substrate, 101 an exposed surface of the peripheral part of the substrate, 102 a first electroconductive-type semiconductor layer, 103 a light-emitting layer, 104 a second electroconductive-type semiconductor layer, and 105 a p-type electrode. The illustrated semiconductor layer represents a basic construction. Quite naturally, it may further incorporate therein a buffer layer, a clad layer and a contact layer, for example.

The nitride semiconductor light-emitting device of this invention is provided with the exposed surface 101 of the substrate resulting from the removal of at least a first part of the nitride semiconductor layer in the peripheral part of the device. The individual devices are obtained by dividing a semiconductor wafer after the wafer has electrodes and the like formed therein. During the course of this division, the boundary surfaces of the individual devices are provided with grooves which are formed by the laser processing till they reach the interior of the substrate.

Figure 3:
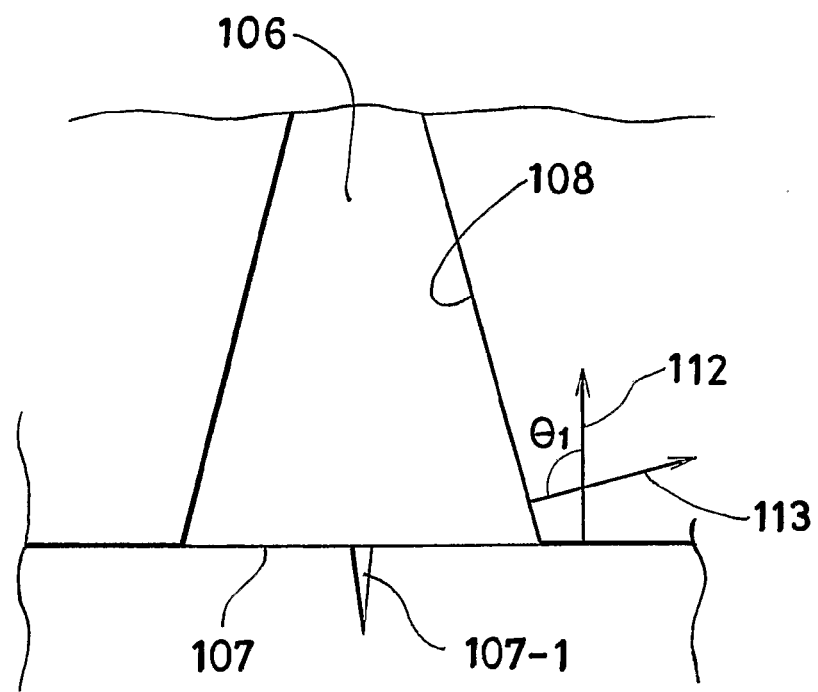
FIG. 3 is a magnified diagram of the depressed groove shown in FIG. 1.

Further, part of the nitride semiconductor layer except the peripheral part thereof is removed till the substrate and consequently the substrate is exposed in the part of removal. Owing to the removal, a depressed groove 106 possessing an opening 109 is formed in the first surface of the semiconductor layer. The leading terminal of this depressed groove may either reach the first surface of the substrate or remain inside the substrate. FIG. 3 is a magnified cross section of this depressed groove part. In FIG. 3, 107 denotes a substrate surface in the bottom part of the depressed groove, 108 a tilted surface of the depressed groove, 109 an opening of the depressed groove, 112 the normal line relative to the principal plane of the substrate, 113 the normal line relative to the tilted surface 108, and $\theta_1$ the angle formed by the normal lines 112 and 113.

The provision of the depressed groove in the semiconductor layer results in adding to the number of surfaces of the semiconductor layer and enhancing the light-extraction efficiency for the reason adduced above. The depressed groove is preferred to assume a shape enlarging toward the lower side (in the direction of the substrate), namely a shape having the lateral faces of the depressed groove tilted toward the substrate. Further preferably, part of the bottom surface of the depressed groove lies directly below the electrodes.

The angle $\theta_1$ which represents the degree of tilt of the depressed groove can be selected in a wide range, possibly in the range of larger than 90 degrees and smaller than 180 degrees, preferably in the range of 95 degrees or more and 170 degrees or less, and more preferably in the range of 100 degrees or more and 160 degrees or less.

The part for removing the nitride semiconductor layer except the peripheral part of the device (the opening 109) is provided at least singly and the circumferential length thereof may be selected in a wide range. This length expressed in the ratio to the circumferential length of removal in the peripheral part of the device, for example, is selected freely in the range of 1 to 1000%, preferably in the range of 5 to 500%, and more preferably in the range of 10 to 200%.

Figure 5:
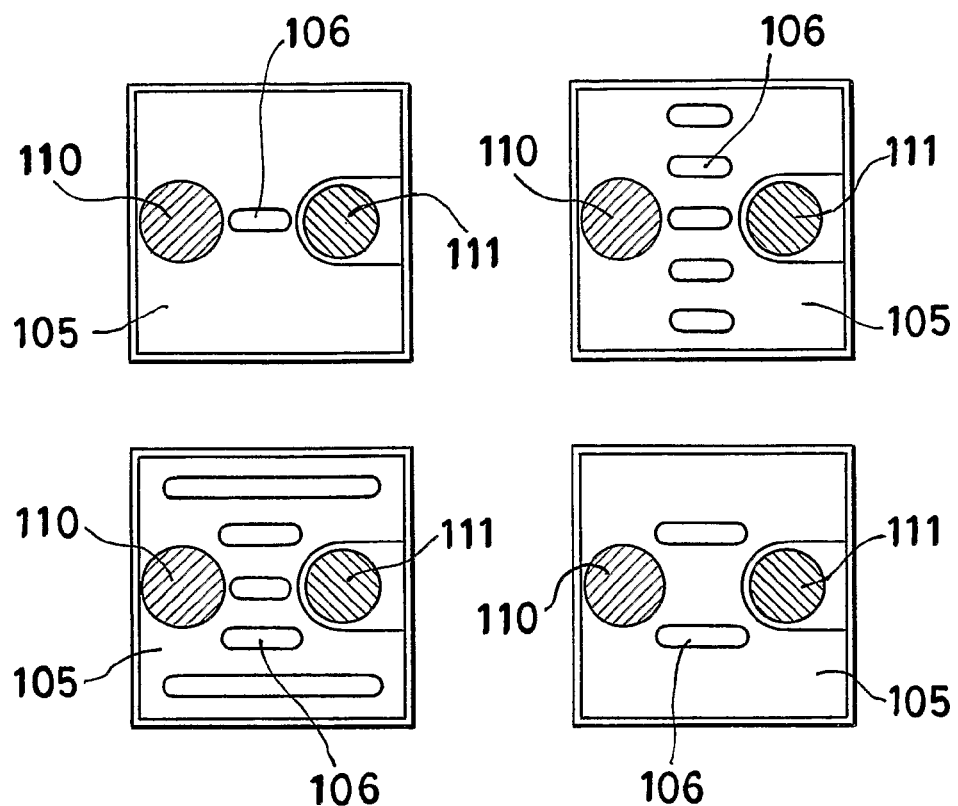
FIG. 5 is a plan view of a nitride semiconductor light-emitting diode illustrating the depressed groove in various shapes.
Figure 6:
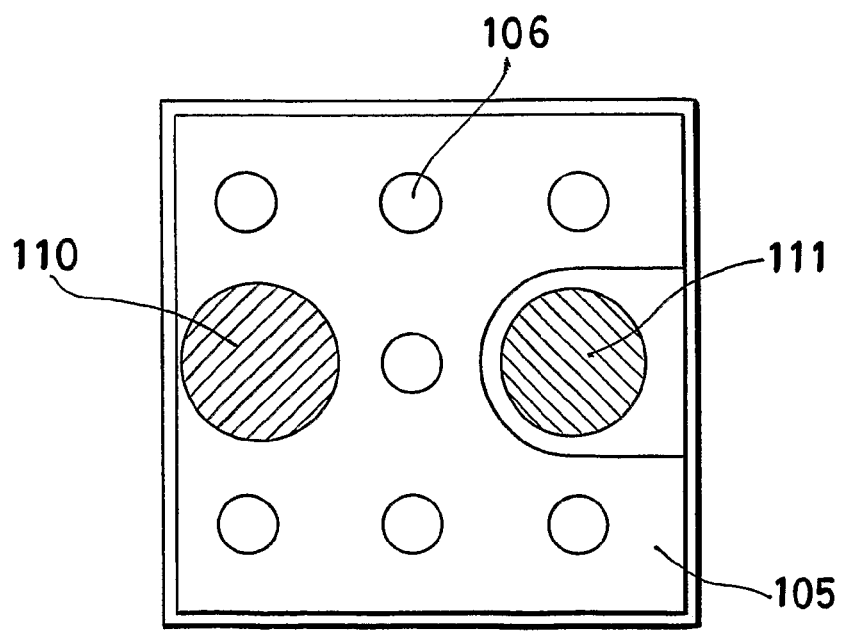
FIG. 6 is a plan view of a nitride semiconductor light-emitting diode formed in Example 2.
Figure 9:
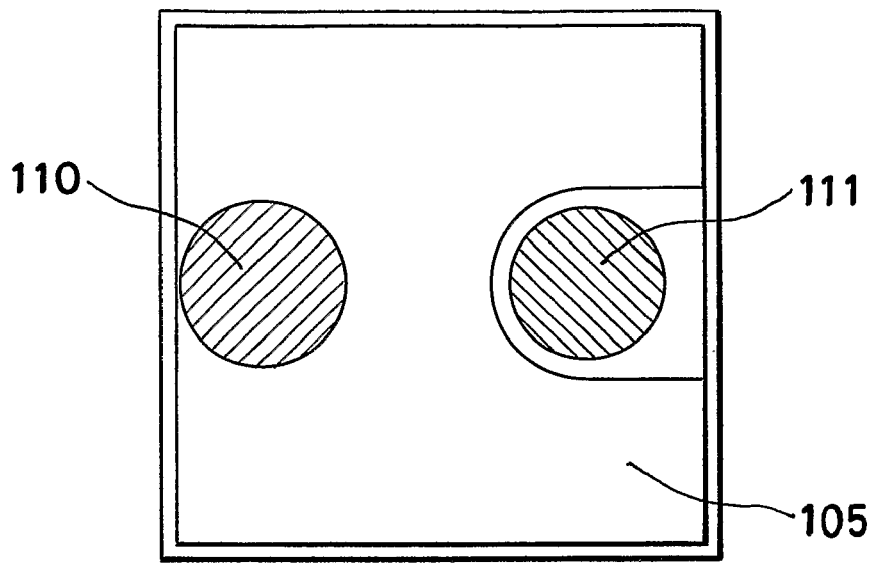
FIG. 9 is a plan view of a conventional nitride semiconductor light-emitting diode.

The shape of the opening can be selected without any particular restriction. It may be in a rectangular shape, a shape enclosed with straight lines like a square, or a shape encompassed with a curve like a circle. Particularly, the circle is preferred to have a diameter approximating the diameter of a laser beam to be used for the forming. In this case, the removed part is allowed to have a larger circumferential length relative to the fixed area of removal. The opening is preferred to have the side or the diameter enlarged toward the lower side. The numbers and the shapes of the opening are illustrated in FIG. 1, FIG. 5 and FIG. 6.

The substrate surface exposed by the removal of the semiconductor layer inside and outside the peripheral part of the device and the lateral face of the semiconductor layer may be provided with a reflecting film (not shown) which is aimed at reinforcing the extraction of light by total reflection. This reflecting film may be any of the known reflecting films, such as a reflecting film formed of metal and a reflecting film using dielectric multilayer film. In the method resorting to the dielectric multilayer film, combinations of oxides, such as $SiO_2/TiO_2$ and $SiO_2/ZrO_2$, for example, belong to the known art. As a high reflecting film of metal, Ag, Pt, Rh and Al, for example belong to the known art.

It is preferred that the surface of the substrate which has been exposed in consequence of the formation of the opening is provided in the central part thereof with a processed mark 107-1 substantially conforming to the shape of the opening. Also by this measure, the light-extraction efficiency can be enhanced. The processed mark is formed during the processing with a laser in the substrate in a shape having a cross section like a groove.

The presence of the processed mark is equivalent to the act of providing the substrate with an opening even for the light which is advancing by total reflection inside the substrate. Through the processed mark, the light is extracted via the removed part of the nitride semiconductor layer.

Figure 4:
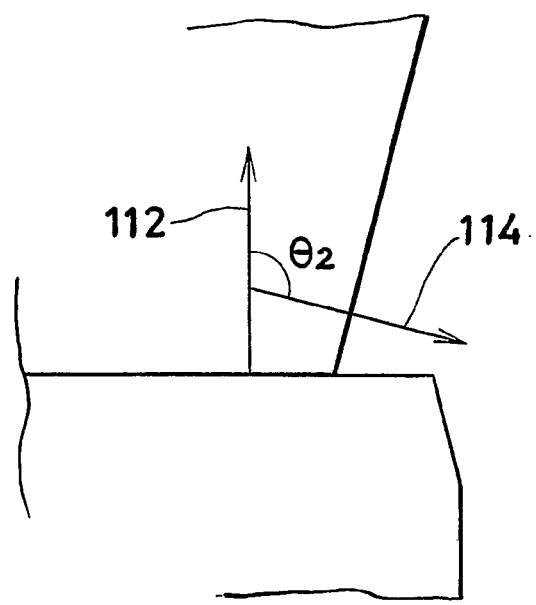
FIG. 4 is a magnified diagram of the exposed surface of the substrate in the lateral face of FIG. 1.

The nitride semiconductor light-emitting device of this invention prefers the lateral face of the nitride semiconductor layer thereof to be tilted toward the outside. The state of this tilting is shown in FIG. 2 and the magnified view of the tilted part is shown in FIG. 4. In FIG. 4, 112 denotes the normal line relative to the substrate surface and 114 the normal line relative to the tilted face. The angle formed by these normal lines is denoted by $\theta_2$. This angle $\theta_2$ can be also selected similarly to the aforementioned $\theta_1$ in the range of larger than 90 degrees and smaller than 180 degrees. It is preferably in the range of 95 degrees or more and 170 degrees or less and more preferably in the range of 100 degrees or more and 160 degrees or less.

By tilting the lateral face of the semiconductor layer as described above, it is made possible to enhance the light-extraction efficiency. Though the reason for this enhancement is not definitely clear, it may be explained by the following supposition. This supposition will be explained below with reference to FIG. 7 and FIG. 8.

FIG. 8 depicts a conventional nitride semiconductor. In the case of the light which is emitted at the point A and advanced like an arrow line, for example, when this light impinges on the lateral face of the semiconductor at an angle larger than the critical angle, it is reflected at the point of incidence and is further reflected on the phase boundary between the semiconductor layer and the substrate. As a result, the light-extraction efficiency is lowered.

In contrast thereto, the light in the case of FIG. 7 is reflected on the lateral face of the semiconductor layer but is passed through the boundary surface between the semiconductor layer and the substrate and eventually extracted from the device because the angle of incidence is within the critical angle.

While the nitride semiconductor is generally grown on a heterogeneous substrate, the nitride semiconductor and the heterogeneous substrate have different refractive indexes. When the light is propagated within a layer object, it is returned by a perpendicular end face into the object because of the reflection on the end face. When the end face is a tilted surface as in the case of this invention, the tilted surface changes the direction of the advance of the light and makes a contribution to the extraction of the light through a different surface.

This invention prefers that the lateral faces of the nitride semiconductor layer and the substrate lying in the same direction do not form a continuous surface. Though this invention contemplates concentrating the light into the nitride semiconductor layer, it abhors this formation of the continuous surface because such an empty space as illustrated in FIG. 7, when suffered to occur in the outer side part of the joint surface of the nitride semiconductor layer and the substrate, tends to enlarge the change of the refractive index at that point and induce the return of the light toward the light-emitting surface side.

For the substrate intended to stack the Group III nitride semiconductor thereon in this invention, any of the known substrate materials, such as single oxide crystals represented by sapphire single crystal ($Al_2O_3$; A plane, C plane, M plane and R plane) and spinel single crystal ($MgAl_2O_4$) and SiC single crystal, can be used without any particular restriction. Among other substrate materials enumerated above, sapphire single crystal proves particularly advantageous. Sapphire has a refractive index of 1.7 which is smaller than the refractive index of the nitride semiconductor. Thus, the effect of processing which is provided inside the nitride semiconductor layer for the purpose of enhancing the extraction of light can be manifested to the maximum. Incidentally, the plane direction of the substrate is not particularly restricted. The substrate may be a just substrate or a substrate endowed with an off angle. The surface of the sapphire substrate may be a mirror surface or a corrugated surface. The formation of the corrugated surface can be accomplished by means, such as etching and laser ablation.

On the substrate mentioned above, the nitride semiconductor layer containing a first electroconductive-type layer, a light-emitting layer, and a second electroconductive-type layer is stacked under the optimum conditions for the component layers. The nitride semiconductor of this invention is represented by the general formula $Al_xGa_{1-x-y}In_yN$ ($0 \leq x, y \leq 1, 0 \leq x+y \leq 1$).

After the nitride semiconductor layer has been stacked on the substrate, the region for forming a negative electrode and the regions for dividing the component devices are patterned by the known photolithographic process. As regards the disposition of the region for the formation of the negative electrode, while this region is preferred to be in the diagonal position relative to the region for the formation of a positive electrode, it may be in other position. The patterning may be carried out after the formation of the positive electrode.

The regions for the division of the component devices are formed in shapes delimiting the regions including a negative electrode and a positive electrode generally rectangularly at the same time as the regions for the formation of the negative electrode are formed. In this invention, since the removal of the nitride semiconductor layer is accomplished by combining the removal with a laser and the removal by wet etching, the formation of the regions for the division of the component devices may be omitted.

The nitride semiconductor layer on the substrate which has been patterned by photolithography is etched by dry etching. In this case, a chlorine type gas is adopted generally as the gas species to be used for the etching. The known chlorine type gases include $Cl_2$, $SiCl_4$ and $BCl_3$ and mixtures thereof with additive gases, such as $H_2$ and Ar. Their combinations may be properly selected and put to use.

The process under discussion here is an operation that accompanies plasma. This process, therefore, is preferred to be carried out prior to a wet treatment. It may be performed before or after the process of removal of the nitride semiconductor layer with the laser which continues till the substrate is reached.

The negative electrode is widely known in various compositions and structures. Any of these known negative electrodes may be used without any particular restriction. As the contact material to be used for joining the negative electrode with the n contact layer, not only Al, Ti, Ni and Au but also Cr, W and V are available. It goes without saying that the negative electrode may be wholly formed in a multilayer structure and consequently enabled to acquire a bonding property. Particularly, the Au coating of the outermost surface is at an advantage in facilitating the process of bonding.

The positive electrode is widely known in various compositions and structures. These known positive electrodes can be used without any particular restriction.

The transparent positive electrode materials may contain elements, such as Pt, Pd, Au, Cr, Ni, Cu and Co. It is known that by forming such a material in a partly oxidized construction, it is made possible to enhance the perviousness of the material.

The transparent positive electrode materials may be electroconductive oxides besides the metals enumerated above. Known electroconductive oxides, such as $In_2O_3$, ITO, ZnO and $SnO_2$, are available. They may be transparent electrodes which result from combining the metals mentioned above with the oxides mentioned above.

Now, the removal of the semiconductor layer by laser processing and wet etching will be explained below.

Figure 10:
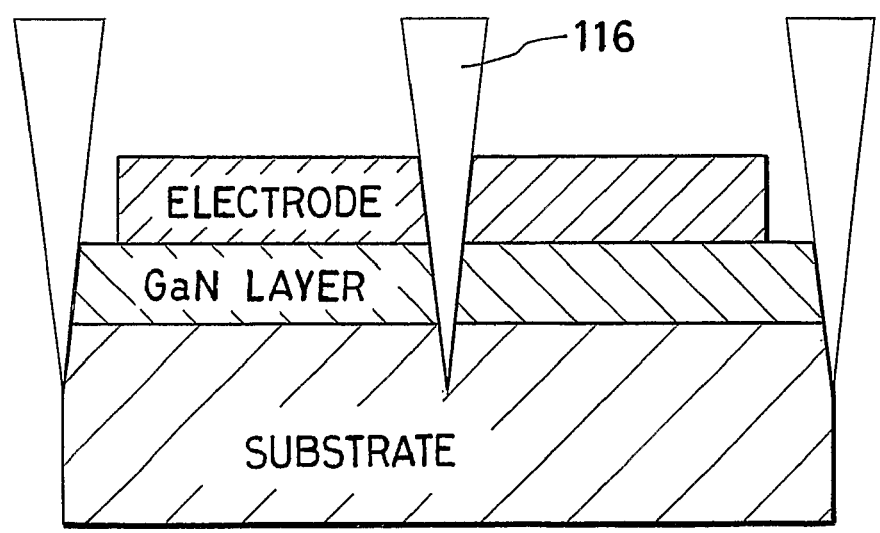
FIG. 10 is a schematic cross-sectional view illustrating the state of a device being processed with a laser.
Figure 11:
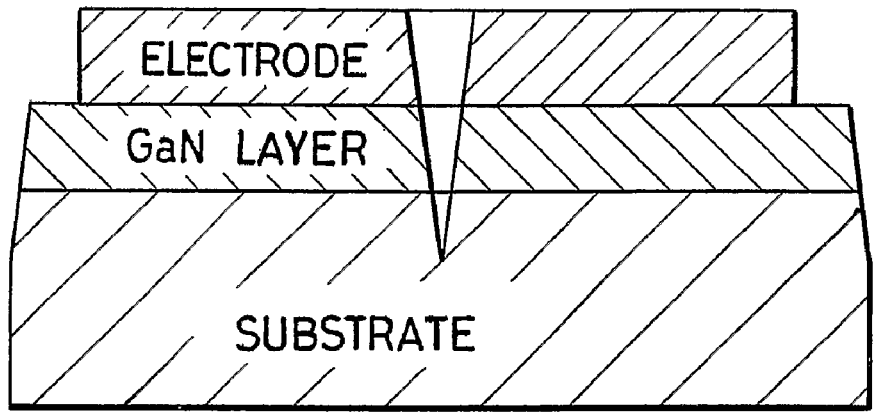
FIG. 11 is a schematic cross-sectional view illustrating the state of a device resulting from the laser processing.
Figure 12:
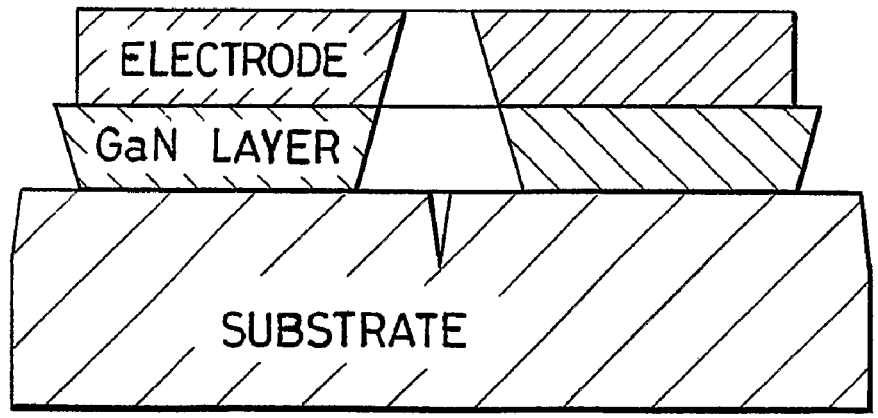
FIG. 12 is a schematic cross-sectional view illustrating the state of a device being processed by wet etching.

FIG. 10 is a schematic cross-sectional view illustrating the irradiation of the semiconductor layer, etc with a laser, FIG. 11 is a schematic cross-sectional view illustrating the state of a device denuded of the semiconductor layer, etc by the irradiation, and FIG. 12 is a schematic cross-sectional view illustrating the state of the device denuded of the semiconductor layer by wet etching. In FIG. 10, 116 denotes a laser beam.

When the individual devices have been separated asunder, each device requires the substrate thereof to be exposed in the peripheral part thereof. For this purpose, the semiconductor layer in the device is removed till the substrate is reached. Then, for the purpose of forming a depressed groove in the semiconductor layer except the peripheral part, the semiconductor layer is removed till the substrate is reached. This removal is initially effected with a laser (FIGS. 10 and 11). In this case, the laser is preferred to have a wavelength shorter than the absorption terminal of the nitride semiconductor. Owing to the high absorption coefficient of the nitride semiconductor, the position to be processed is limited to the position that is irradiated with the laser. By properly selecting the optical system for the laser, it is made possible to effect the process in a width even smaller than 10 µm and consequently enhance the yield of the devices.

In the process for removing the nitride semiconductor layer of the device in the peripheral part thereof, the depth of processing with the laser in the substrate may be arbitrarily selected in the range exceeding 1 µm. If the processing depth is unduly small, the shortage will possibly result in impairing the shapes of the individual devices to be obtained by the subsequent treatment of separation. When the processing depth is 10 µm or more, the occurrence of this impairment can be suppressed. The processing depth of 20 µm or more proves still more advantageous.

The process for removing with a laser a part of the nitride semiconductor contiguous to the transparent electrode except the peripheral part may be carried out under the same condition as the process for the removal of the peripheral part or under a different condition. Since the large processing depth tends to induce the impairment of the shapes of the devices to be obtained in the subsequent treatment of separation, the amount of the removing process is preferred to be smaller than the removing process in the peripheral part. The occurrence of the impairment of the shapes of the separated devices is suppressed by keeping the processing depth preferably below 10 µm and more preferably in the neighborhood of 5 µm.

The process for removing at least part of the nitride semiconductor with a laser till the substrate is reached may be preceded by an additional preparatory process for removing part of the transparent electrode or the nitride semiconductor layer. For this purpose, the nitride semiconductor is masked except the part to be removed with the laser so as to protect the part except the regions to be removed. In this case, no problem arises when the region which is not masked is larger than the part to be removed with the laser. This process may be carried out at the same time as the process for separating the individual devices prior to the formation of the electrode.

For the masking, $SiO_2$ and a resist are usable. Among other conceivable masking materials, the resist which is used during the operation of patterning in the course of the masking operation in the process mentioned above proves particularly advantageous because it can be used in its unmodified form as the mask during the removal of the transparent electrode and the nitride semiconductor layer It may be used as the mask during the wet etching operation subsequent to the removal with the laser instead of being used for the patterning.

Subsequent to the removal of the semiconductor layer with the laser, the wet etching operation will be performed for further removal of the semiconductor layer (FIG. 12). This wet etching is implemented with phosphoric acid, sulfuric acid, KOH, etc. The etching agent is added to a beaker stowed in advance in a prescribed heating device and then heated to a temperature in the range of 100° C. to 400° C. If the heating temperature is unduly low, the etching speed will be lowered. If it is unduly high, the excess heat will result in coarsening the etched surface. Preferably at a temperature in the range of 150° C. to 300° C., a sufficient etching speed and a good etched surface are obtained.

The etched lateral face varies with the etching condition. If the etching temperature is unduly low, the perpendicularly etched face will gain in development. If the etching temperature is unduly high, the face tilted toward the substrate will gain in development. In the range of the intermediate temperature, the case of mixing these two situations is liable to occur. What actually occurs in this case may be an angle intermediate between a tilted face which develops at an elevated temperature and a perpendicular face or a tilted face developing on part of the lateral face plus a perpendicular face on the remainder of the lateral face. Though the tilted face in most cases appears as a facet plane of (1-101), it may occur otherwise. The preferred temperature range for obtaining the tilted surface is 200 to 300° C.

The tilted surface on the lateral face of the depressed groove is at an advantage in enabling the extraction of the light by total reflection to be carried out efficiently. The tilted surface formed on the entire lateral face proves particularly advantageous. The tilted surface does not need to be formed on the entire lateral face when the effect of the etching at an elevated temperature on the characteristic properties of the produced devices poses a problem.

It is further known that the nitride semiconductor contains numerous faults of varying sorts ranging from dislocation. During the course of the wet etching operation, these faults possibly give rise to concave faults and convex faults on the surface formed by this etching. This situation is tolerable.

For the purpose of reinforcing the extraction of the light by total reflection on the bottom surface of the depressed groove and the tilted lateral face, it is preferable to have the reflecting film formed on these faces. As the means to form this film, the method which resorts to a magnetron sputter proves particularly advantageous. Some other means may be adopted instead. Further, the metallic film which has been formed as a reflecting film may be used an auxiliary electrode.

The sample, after having the nitride semiconductor layer thereof removed by combining the removal with a laser and the removal by wet etching until the substrate is reached, is separated from the second surface by the use of a breaking device and is tested for characteristic properties of device. When the scribing operation with diamond and the dicing operation performed during the course of breaking are so combined as to attain conformity between the line of breaking and the line of processing effected in the periphery of the device till the substrate is reached, they are at an advantage in enhancing the yield of the shapes of the devices in the process of separation.

Examples of this invention will be cited below.

EXAMPLE 1

On a substrate of sapphire ($Al_2O_3$) C plane, an undoped GaN layer 6 μm thick, an n-type contact layer 4 μm thick having an average carrier concentration adjusted to $1\times10^{19}$ $cm^{-3}$ by cyclically doping Ge, an n-type clad layer of $In_{0.1}Ga_{0.9}N$ 12.5 nm thick, a barrier layer of GaN 16 nm thick and a well layer of $In_{0.2}Ga_{0.8}N$ 2.5 nm thick stacked alternately to a total of five cycles, a light-emitting layer of the multiple quantum well structure provided with a barrier layer, and a p contact layer of Mg-doped (concentration: $8\times10^{19}/cm^3$) $Al_{0.03}Ga_{0.97}N$ 0.15 μm thick were sequentially stacked through an AlN buffer in accordance with the method disclosed in JP-A 2003-243302 to produce a nitride semiconductor layer.

Through the surface of the nitride semiconductor layer, the boundary parts of the individual devices and part of the n-type contact layer were exposed by using the known lithographic process and RIE.

At stated positions on the p contact layer of the compound semiconductor stacked layer, a transparent positive electrode of Pt and Au from the p contact layer side was formed by using the known lithographic process and lift-off process. Subsequently, a bonding pad was formed from the semiconductor side by using the known lithographic process and lift-off process.

The wafer after completing a process for forming an electrode on the individual devices was coated with the photoresist used in the lithographic process. The boundary parts of the devices and the parts forming a depressed groove were exposed substantially linearly as illustrated in FIG. 1 by using the lithographic process again.

The laser processing for removing the nitride semiconductor layer in the boundary parts of the devices till the substrate was performed under the conditions of 266 nm in wavelength, 50 kHz in frequency, 1.6 W in output and 70 mm/second in processing speed. The processing under these conditions resulted in removing the nitride layer and inflicting a processed mark reaching a depth of 20 μm on the sapphire substrate. After the stage was rotated to an angle of 90 degrees, the boundary parts of the devices were processed in the Y-axis direction under the same conditions.

The transparent electrode part was processed in the burst mode by pulse oscillation. The sample stage was scanned under the conditions of 1.6 W in output and 30 mm/second in speed and the laser was oscillated at the time that the sample stage conformed with the processing position. In the irradiated part, the transparent electrode and the nitride layer were removed in the shape of the laser beam. Under the same conditions, the substrate sustained a processed mark 5 μm thick.

The sample after completing the process of partial removal of the nitride semiconductor layer was wet-etched by being immersed for 20 minutes in a quartz beaker holding an aqueous orthophosphoric acid solution and heated to 180° C. by using a heating device. The amount of the nitride semiconductor layer removed by this etching totaled 5.2 μm. The substrate and the nitride semiconductor layer which had completed the wet-etching were washed with water in an ultrasonic wave and were further subjected to organic cleaning till the etching mask formed of the resist was removed.

The substrate and the nitride semiconductor layer which had undergone the etching treatment were abraded on the substrate side till a thickness of 80 μm. Thereafter, the individual devices were separated by a breaking device.

When the separated devices were tested for output with an integrating sphere, the output was found to be 7.1 mW. While the opening on the first surface of the device of nitride semiconductor layer measured 100 μm in length and 10 μm in width, the part contiguous to the substrate inside the device measured 118 μm in length and 28 μm in width.

EXAMPLE 2

An example of this invention obtained under varied conditions will be cited below.

The growth of the nitride semiconductor layer on the substrate and the formation of the electrodes were performed in the same manner as in Example 1. As the mask necessary after the formation of the electrode, an $SiO_2$ mask was deposited on the entire surface of the wafer by a 1000 Å sputter for the purpose of enhancing the resistance to etching as compared with Example 1. Though the laser processing was carried out under the same conditions as in Example 1, it was performed in the pattern of FIG. 6 at the same time as the process for the removal of the nitride semiconductor layer with a laser while the patterning with the $SiO_2$ mask was omitted. The substrate after forming holes therein was wet-etched by being immersed for 20 minutes at 180° C. in the same device as in Example 1.

The wafer surface after undergoing the wet etching was coated again. At the positions of the holes formed in the device surface in the pattern of FIG. 6, the resist was removed by the lithographic process. By depositing Pt by sputtering till 1000 Å to form a reflecting film and the part of Pt in the unnecessary region was removed by the lift-off process, a reflecting film was formed on the lateral faces of the holes. The subsequent treatment and rating were carried out in the same manner as in Example 1.

When the separated devices were tested for output, this output was found to be 8.0 mW. While the opening had a diameter of 10 μm the part contiguous to the substrate inside the device had a diameter of 28 μm.

COMPARATIVE EXAMPLE

An example which omitted the wet etching treatment is cited below for the purpose of comparison.

The growth of the nitride semiconductor layer and the removal of the nitride semiconductor layer were carried out under the same conditions as in Examples 1 and 2.

After the formation of grooves, the individual devices were separated without undergoing a wet etching treatment.

When the separated devices were tested for output, this output was found to be 5.1 mW.

INDUSTRIAL APPLICABILITY

The nitride semiconductor light-emitting device of this invention effects the shaping process directed toward enhancing the output of the light-emitting diode by wet etching which inflicts no significant damage and consequently makes it possible to suppress the degradation of the yield. A light source of a white light can be produced by combining this light-emitting diode with a fluorescent material and it can be used as for a lighting fixture.

The invention claimed is:

1. A method for the production of a nitride semiconductor light-emitting device comprising a substrate, a nitride semiconductor layer incorporating therein a first electroconductive semiconductor layer, a light-emitting layer and a second electroconductive semiconductor layer, a transparent electrode contiguous to at least part of a first surface of the second electroconductive semiconductor layer, and a second electrode contiguous to the first electroconductive semiconductor layer, comprising the steps of:
  removing a first part of the nitride semiconductor layer in a peripheral part of the device till the substrate is exposed to form a first exposed region thereof; and
  removing at least a second part of the nitride semiconductor layer contiguous to the transparent electrode except the peripheral part of the device till the substrate is reached to form a second exposed region thereof;
  wherein the steps are taken by combining the removal first with a laser and then the removal by wet etching.

2. A method for the production of a nitride semiconductor light-emitting device according to claim 1, wherein the removal of at least the second part of the nitride semiconductor layer is increased in a direction of the substrate by controlling conditions of the wet etching so as to provide the semiconductor layer remaining after the removal with a lateral face tilted toward the substrate.

3. A method for the production of a nitride semiconductor light-emitting device according to claim 1, wherein the removal of at least the second part of the nitride semiconductor layer is enabled by controlling conditions of the wet etching to have part of the second exposed region of the substrate fall directly below the electrodes.

4. A method for the production of a nitride semiconductor light-emitting device according to claim 1, wherein the second exposed region of the substrate is provided at a substantially central part thereof with a processed mark in a shape substantially conforming to a shape of the second part of the nitride semiconductor layer by a process using a laser.

5. A method for the production of a nitride semiconductor light-emitting device according to claim 1, wherein the nitride semiconductor layer having the first part removed has a lateral face tilted outwardly by controlling conditions of the wet etching during the removal of the first part of the nitride semiconductor layer.

* * * * *